United States Patent [19]
Farrow

[11] Patent Number: 5,541,961
[45] Date of Patent: Jul. 30, 1996

[54] DIGITALLY CONTROLLED HIGH RESOLUTION HYBRID PHASE SYNTHESIZER

[75] Inventor: Cecil W. Farrow, Highlands, N.J.

[73] Assignee: AT&T Corp., Murray Hill, N.J.

[21] Appl. No.: 290,253

[22] Filed: Aug. 15, 1994

[51] Int. Cl.⁶ .................................................. H04L 7/00
[52] U.S. Cl. ........................................ 375/371; 327/233
[58] Field of Search ................................... 375/371, 373; 326/93; 327/105, 144, 231, 233

[56] References Cited

U.S. PATENT DOCUMENTS

| | | | |
|---|---|---|---|
| 4,049,909 | 9/1977 | Peck | 375/308 |
| 4,617,535 | 10/1986 | Unerdem | 375/308 |
| 4,686,688 | 8/1987 | Chung et al. | 375/274 |
| 4,815,103 | 3/1989 | Cupo et al. | 375/234 |
| 4,821,297 | 4/1989 | Bergmann et al. | 375/376 |
| 4,843,581 | 6/1989 | Cupo et al. | 364/724.01 |
| 5,027,085 | 6/1991 | DeVito | 331/1 A |
| 5,088,057 | 2/1992 | Amrang et al. | 364/703 |
| 5,128,960 | 7/1992 | Van Driest et al. | 375/200 |
| 5,136,617 | 8/1992 | Stenard | 375/357 |
| 5,163,066 | 11/1992 | Cupo et al. | 375/232 |
| 5,184,092 | 2/1993 | Shahriary et al. | 331/16 |
| 5,204,882 | 4/1993 | Chao et al. | 375/354 |
| 5,214,396 | 5/1993 | Cheon | 375/282 |
| 5,237,290 | 8/1993 | Banu et al. | 331/2 |
| 5,247,544 | 9/1993 | LaRosa et al. | 375/371 |
| 5,259,005 | 11/1993 | LaRosa et al. | 375/355 |
| 5,259,007 | 11/1993 | Yamamoto | 375/376 |
| 5,272,452 | 12/1993 | Adachi et al. | 331/17 |
| 5,276,712 | 1/1994 | Pearson | 375/360 |
| 5,285,479 | 2/1994 | Iwane | 375/298 |
| 5,287,182 | 2/1994 | Haskell et al. | 375/376 |

*Primary Examiner*—Young T. Tse

[57] ABSTRACT

An incremental phase shifter for digital signals adapted to combine weighted amount of two quadrature square waves so as to generate a wave having a phase intermediate the respective phases of the two quadrature square wave signals. The generated wave is then processed in a limiting and integrating circuit so as to produce a square wave which is linearly related to the assigned weighted amounts of the two quadrate square waves.

7 Claims, 5 Drawing Sheets

000000
DIGITALLY CONTROLLED HIGH RESOLUTION HYBRID PHASE SYNTHESIZER

FIELD OF THE INVENTION

The present invention relates to components in synchronous digital communication systems and, more particularly, to digitally controlled circuitry having selectable phase resolution for clock recovery.

BACKGROUND OF THE INVENTION

In digital communication systems, information is transferred between sending and receiving terminals over a transmission line or, more generally, a communication channel in a format suitable for that channel. The format can be a baseband signal or, using a digitally modulated carrier, a bandpass signal. In either case, the signal is characterized by a fundamental baud or symbol rate, i.e., the clock frequency of the data.

In synchronous digital communications, it is frequently necessary to extract a coherent clock signal from a received input data stream. This process is known as clock recovery. The recovered clock enables the receiving terminal to optimally sample the received digitally encoded communication signals. Clock recovery circuits commonly are employed, for instance, in conjunction with analog data communications over telephone or radio channels.

Conventional clock recovery circuits typically employ phase-locked loops ("PLL's"). A typical PLL has a voltage-controlled crystal oscillator (VCXO) whose phase is locked onto a frequency component of its input signal. The PLL also has a phase detector for comparing the phase of the oscillator with the phase of the input signal, and for developing a voltage proportional to the phase differential, which commonly is referred to as a "phase error". This voltage is filtered and applied as a control voltage to the oscillator so as to adjust the oscillator's frequency. Due to negative feedback, the phase error is driven to a value which is preferably small, and the oscillator's frequency consequently is kept equal to the input frequency. However, the aforementioned VCXO is disadvantageous in that it is not versatile (it is not readily adaptable in other circuit schemes) and has a long delivery time on frequency. Further, high resolution Digital-to-Analog converters which are required to drive VCXO's are complex and expensive to implement.

In contrast, crystal oscillators provide both inherent stability characteristics and do not need the requirement of the aforementioned Digital-to-Analog converter required to drive the voltage controlled crystal oscillator.

It is thus an object of the present invention to provide a variable phase shifter which employs a crystal oscillator to be incorporated into clock extraction circuitry and is adaptable for the implementation of a wide range of crystal oscillators.

SUMMARY OF THE INVENTION

The present invention is directed towards a digitally control high resolution phase synthesizer incorporating an incremental phase shifter. The phase synthesizer is configured to be implemented into clock extraction circuitry and is adapted to generate an output square wave which has a variable phase relationship to generated quadrature square waves and an input reference signal.

The phase synthesizer includes a reference signal source and frequency dividing means for dividing a frequency of the reference signal source by a predetermined divide ratio. Preferably, the divide ratio of the reference signal source is four (4) and the reference signal source includes a crystal oscillator. Further, the phase synthesizer includes an accumulator circuit for receiving a 6-bit input signal and for generating a carry signal in dependence upon the input signal. Preferably, the four (4) least significant bits of the input signal is determinative for either generating a logic "HIGH" or logic "LOW" carry signal.

A multiplexer is provided for generating an adjacent pair of signals from the signal generated from the aforementioned frequency dividing means. The carry signal is also inputted into the multiplexer and is determinative for generating the adjacent pair of signals. Shifting means is coupled to the multiplexer and is adapted for shifting the adjacent pair of signals generated from the multiplexer by a prescribed amount. Circuit weighing means is coupled to the shifting means and is adapted to derive a signal having a phase within the phase range defined by the phases of the adjacent pair of signals. Preferably, the circuit weighing means includes a finite impulse response filter having a plurality of summing resistors.

BRIEF DESCRIPTION OF THE DRAWINGS

The foregoing features of the present invention will become more readily apparent and may be understood by referring to the following detailed description of an illustrative embodiment of an apparatus according to the present invention, taken in conjunction with the accompanying drawings, in which.

DETAILED DESCRIPTION OF THE PREFERRED EMBODIMENTS

Figure 1:
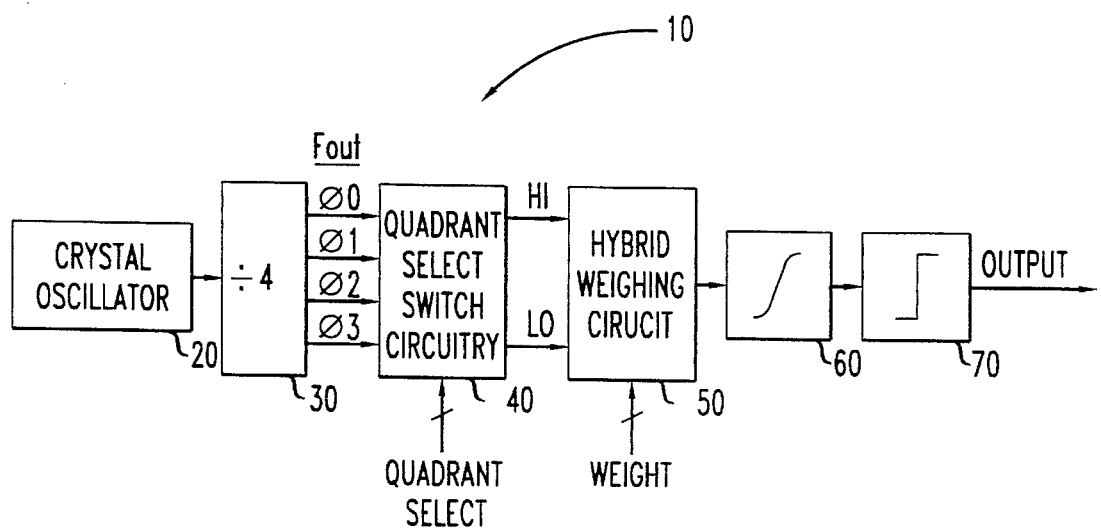
FIG. 1 illustrates a simplified block diagram of the phase synthesizer embodying the present invention.

Referring now to the drawings, in which like reference numerals identify similar or identical elements, FIG. 1 illustrates a simplified block diagram of a phase synthesizer 10 for recovering a clock signal from digital communication signals in accordance with the present invention. The phase synthesizer 10 includes a master crystal oscillator (MCO) 20 coupled to a counting circuit 30. The counting circuit 30 is coupled to quadrant select switch circuitry 40 which is coupled to a hybrid weighting circuit 50. The hybrid weighting circuit 50 is coupled to a conventional integrator circuit 60 and limiter circuit 70.

The counting circuit 30 is driven by the MCO 20 to generate a four (4) phase square wave output at $F_{out}$ designated, respectively, $\phi_0$, $\phi_1$, $\phi_2$ and $\phi_3$. $F_{out}$ is preferably ¼ the periodic frequency of the MCO 20, and the period of each respective wave $\phi_0$, $\phi_1$, $\phi_2$ and $\phi_3$ is to equal "T". Typically, MCO 20 has an operating frequency of 49.408 MHz, thus each respective wave $\phi_0$, $\phi_1$, $\phi_2$ and $\phi_3$ of $F_{out}$ is to correspondingly have a frequency of 12.352 MHz with T=1/12.352 MHz. An adjacent pair of phases from the four (4) phases ($\phi_0$, $\phi_1$, $\phi_2$ and $\phi_3$) of $F_{out}$ is selected by the Quadrant Select switches 40 to represent one of the four (4) quadrants of the four (4) phase signal $F_{out}$. The two elements of the aforementioned adjacent pair of signals are designated LO and HI, respectively. The hybrid weighting circuit 50 combines weighted amounts of LO and HI to generate a wave with a phase between the phase of the LO and HI pair.

It is appreciated, either element, HI or LO, may be utilized as a reference value, as will be described in greater detail below. For example, if LO is used as a reference value, then the weighted output (W) equals w(HI)+(l-w)LO, wherein w corresponds to a selected incremental value. Output W is then integrated by integrator circuit 60 and limited in limiter circuit 70 to have a phase value of LO+(w●T)/4+ (a constant), wherein the constant corresponds to a fixed offset. For example, if the increments of w are 1/16 of the frequency of the MCO 20, then the phase synthesizer 10 generates 64 phases of a square wave output which is equivalent to 16 phases of the MCO 20 output.

Figure 2:
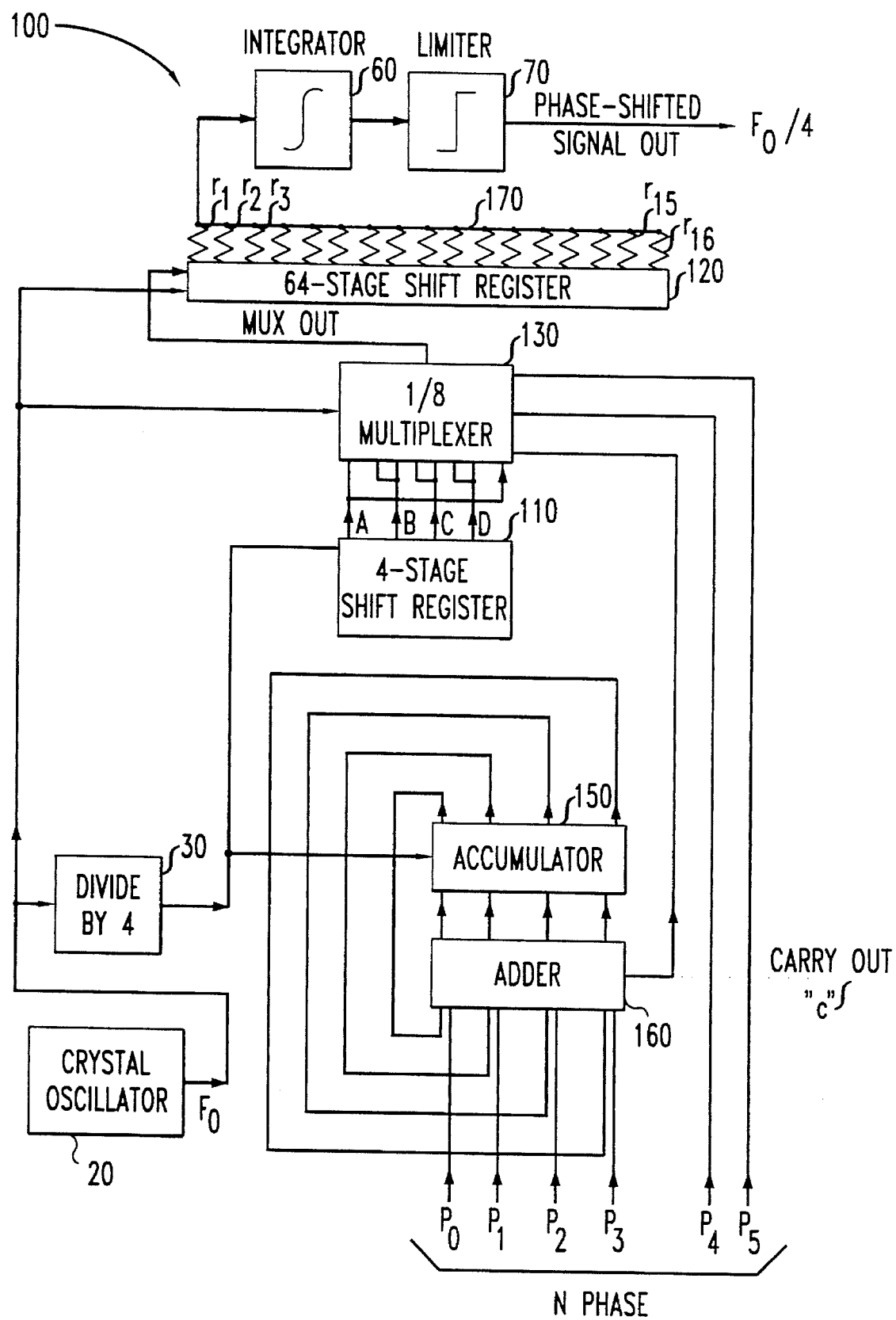
FIG. 2 illustrates the phase synthesizer of FIG. 1 in accordance with a preferred embodiment of the subject invention.

Turning to FIG. 2, there is illustrated a preferred embodiment of the phase synthesizer 10 (FIG. 1), designated generally at 100, adapted for implementation in preferably a medium scale integration logic chip. As mentioned above, the MCO 20 operating at preferably 49.408 MHz is divided by four (4) by the counting circuit 30 to give rise to 4 phases ($\phi_0$, $\phi_1$, $\phi_2$ and $\phi_3$) of a 12.352 MHz signal. The cycles of the two square waves LO or HI are selected in the 4-stage shift register 110 and output, as shown in FIG. 5, as 4 Stage Register Outputs "D" and "A" into a 64-bit shift register 120, via a ⅛ multiplexer 130. The 64-bit shift register 120 operates at the clock rate corresponding to the MCO 20 (49.408 MHz). It is to be appreciated that it is to be understood that the clock rate for the MCO 20 is not to be limited to 49.408 MHz, but rather may operate at any suitable clock rate.

Figure 5A:
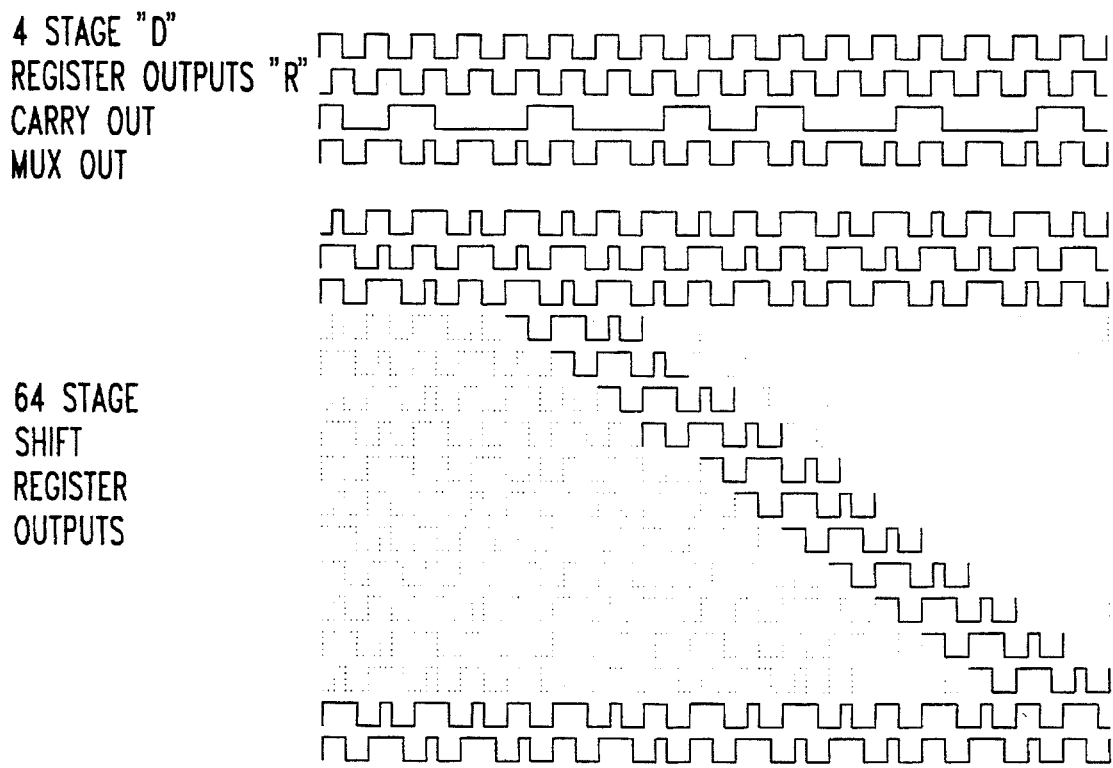
FIG. 5A and 5B illustrate a timing diagram of representative signals utilized in the incremental phase shifter of FIG. 1.
Figure 5B:
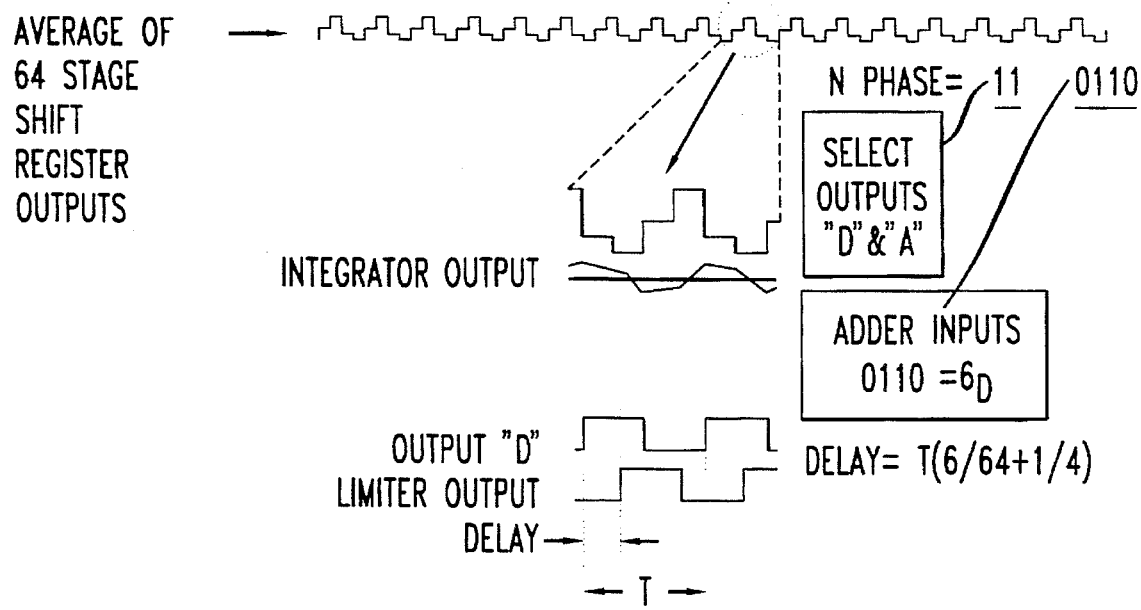

The input ($N_{phase}$) to the phase synthesizer 100 is preferably a 6-bit binary number ($P_0$, $P_1$, $P_2$, $P_3$, $P_4$, $P_5$ and $P_6$) representing a selected phase of the square wave output. The two (2) most significant bits ($p_4$,$p_5$) of $N_{phase}$ are utilized in the ⅛ multiplexer 130 to select the quadrant or which pair of the aforementioned four (4) quadrature outputs is to be output to give rise to the values of LO and HI (the adjacent phases from these signals). It is to be appreciated that for any setting of $N_{phase}$, the sequence in the 64-bit stage shift register 120 will be periodic with 16 cycles of $F_{out}$, as shown in FIG. 5A.

The four least significant bits ($P_0$, $P_1$, $P_2$ and $P_3$) of the aforementioned 6-bit binary number $N_{phase}$ are used to update an arithmetic accumulator circuit 150 and adder circuit 160. The rate of the carries output (C), as illustrated in FIG. 5A, from the adder circuit 160 is proportional to the number fed into the accumulator 150 and is utilized to generate the particular square wave (LO or HI), as is also illustrated in FIG. 5A, to be outputted from the multiplexer 130. For example, if the carry (C) is "0", then the output from the multiplexer 130 is LO. If the carry (C) is "1", then the output from the multiplexer 130 is HI. The number of carries (C) outputted from the accumulator 150 in 16 clock cycles is equal to the value of the 4 least significant bits ($P_0$, $P_1$,$P_2$, $P_3$) of the input signal $N_{phase}$.

The square waves (LO or HI) are outputted serially from the multiplexer 130 and are inputted into the 64-stage shift register 120. Every 4th stage of 64-stage shift register 120 is coupled to a summing resistor, wherein there are 16 respective summing resisters ($r_1$, $r_2$, ... $r_{16}$) coupled to the shift register 120. The summing resistors ($r_1$, $r_2$, ... $r_{16}$) constitute a finite impulse response filter whose output is the weighted sum of W=w●HI+(l-w)●LO, wherein the outputted signals from the summing resistors are, respectfully, illustrated in FIG. 5A. The common node 170 of the aforementioned resistors ($r_1$, $r_2$, ... $r_{16}$) is coupled to the input of the integrator circuit 60 whose output as shown in FIG. 5A (Average of 64-stage shift Register Outputs with the signal magnification shown in FIG. 5B) and is coupled to the input of the limiter circuit 70. The output of the limiter circuit 70 generates a square wave ($f_c$/4) of approximately 12.352 MHz.

Figure 3:
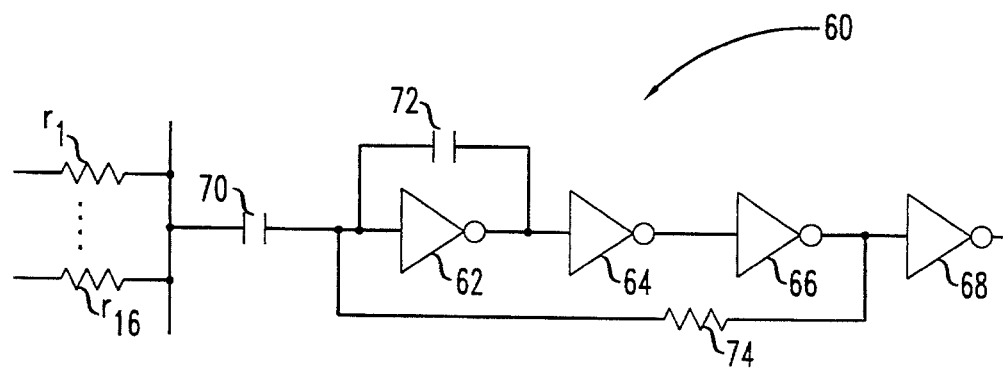
FIG. 3 illustrates a preferred embodiment for the integrator/limiter circuit of FIG. 1.

FIG. 3 illustrates a preferred embodiment integrataor/limiter circuit of the integrator circuit 60 and limiter circuit 70 of FIG. 2, designated generally at 61. Integrator/limiter circuit 61 preferably employs voltage inverters 62, 64, 66 and 68 in series with one another. The aforementioned voltage inverters are preferably model number 74HCUO4, commercially available from National Semiconductor. The voltage inverters 62, 64, 66 and 68 are each provided with a predetermined gain enabling them to function as amplifiers in conjunction with the associated resistors and capacitors of circuit 61. The integrator/limiter circuit 61 further includes a first capacitor 71 coupled intermediate the summing resistors ($r_1$, $r_2$, ... $r_{16}$) and a second capacitor 72 coupled in parallel to inverter 62 and a resistor 74 coupled in parallel to inverters 62, 64 and 66. It is noted capacitor 71 functions as a DC blocking capacitor and capacitor 71 in conjunction with resistor 74 function as a high pass filter operative to suppress any direct current. It is to be appreciated that the aforementioned and described circuit arrangement 61 is not to be understood to be the only integrator/limiter circuit arrangement, as it is to be understood that one ordinarily skilled in the art may implement numerous integrator/limiter circuit arrangements to generate W=w*HI+(l-w)*LO.

Figure 4:
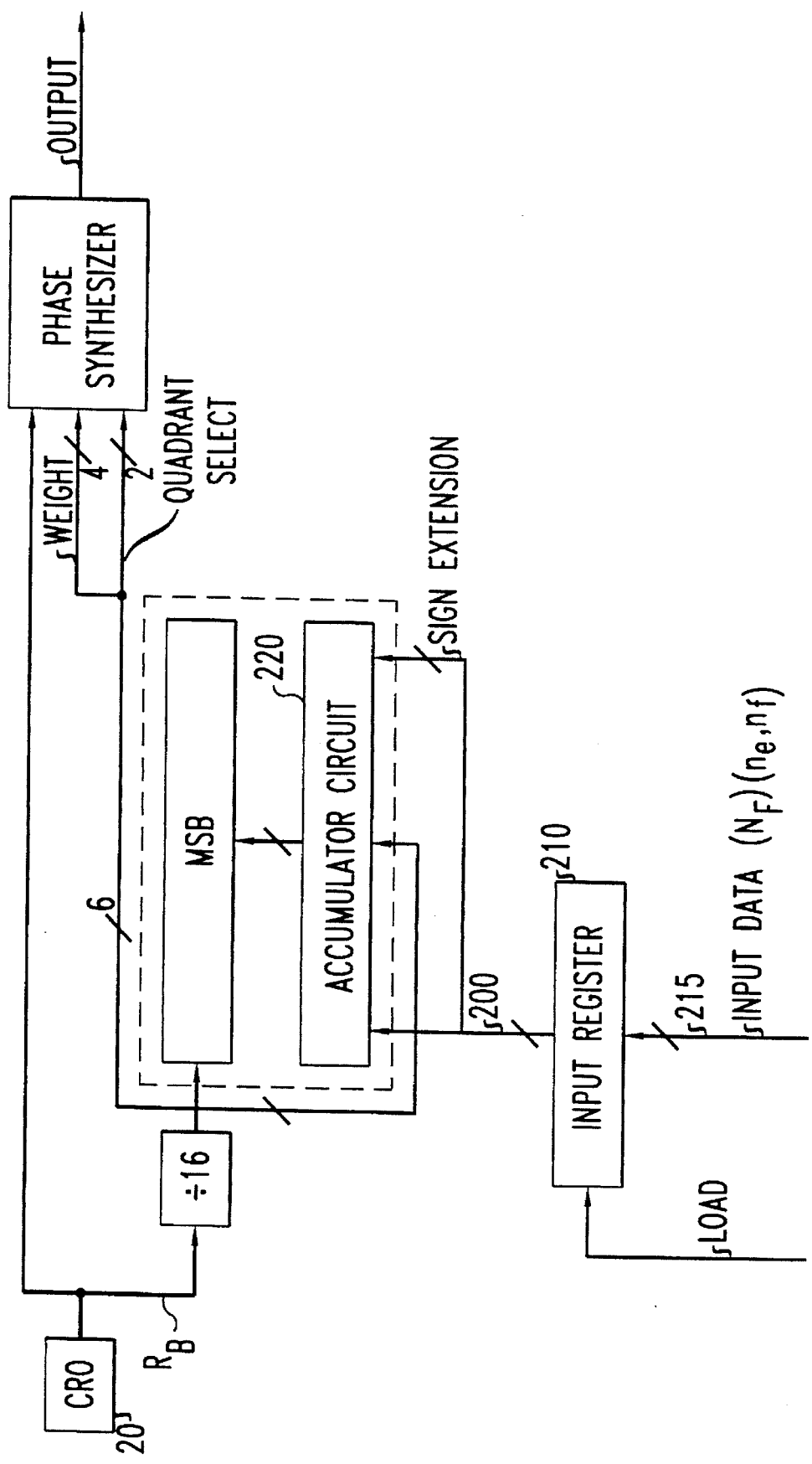
FIG. 4 illustrates the phase synthesizer of FIG. 1 in accordance with another preferred embodiment of the subject invention.

Turning to FIG. 4, there is illustrated another preferred embodiment of the phase synthesizer 10 (FIG. 1), designated generally at 101. In particular, phase synthesizer 101 is adapted for implementation in a DSP Timing Recovery Phase Locked Loop (PLL) scheme. An N-bit number ($N_f$, line 200) having sign extension, as is conventional, is added into an M-bit wide accumulator circuit 220, via input register 210, periodically at a block rate $R_b$, line 215. The number $N_r$ loaded into the input register 210 is preferably between –½ to ½. The number $N_f$ loaded into the input register 210 is determined by an associated Digital Signal Processor (DSP) (not shown).

With the number $N_f$ set to either its maximum or minimum, wherein –½<$N_f$<½, it takes $2^9$ counts for the accumulator circuit 220 to complete a full cycle. Therefore, with the periodic rate (R) being equal to $F_{out}$/16 (the counting circuit 30 has a divide ratio of 16), the maximum deviation (resolution) of $F_{out}$ is +½$^{-28}$, or one part in 8192 and a minimum deviation (resolution) of $F_{out}$ is +½$^{-28}$, or one part in 2.6●$10^8$. Further, by changing the value of "R" to $F_{out/2}$ (the counting circuit 30 has a divide ratio of 2), a maximum deviation of 1/1024 can be obtained while still maintaining excellent resolution.

Therefore, the value of $N_f$ (line 215) is viewed as having a Phase component ($n_p$) and a frequency component ($n_f$). The phase ($n_\phi$) and frequency components ($n_f$) are added together before they are output from the Digital Signal Processor. The frequency components ($n_f$) is a steady (or slowly changing) value, whereas the phase component ($n_{526}$) is used on a block by block basis to correct the timing phase error. Preferably, the Digital Signal processor stores the frequency component ($n_{526}$) and adds a new phase correction on every clock tick of the clock rate $R_B$. Thus, considering the phase component ($n_{526}$) alone, a number ($n_{526}$) is outputted at $f_{out}$ which corresponds to a frequency offset ($f_\phi$) which is the output for one period of the block rate ($R_B$), i.e., $\Delta t_b$. The added phase due to this output is then $F_\phi \bullet \Delta t_b$. Further, in the implementation of second order phase lock loops, the frequency and phase errors can be dealt with independently.

Figure 6:
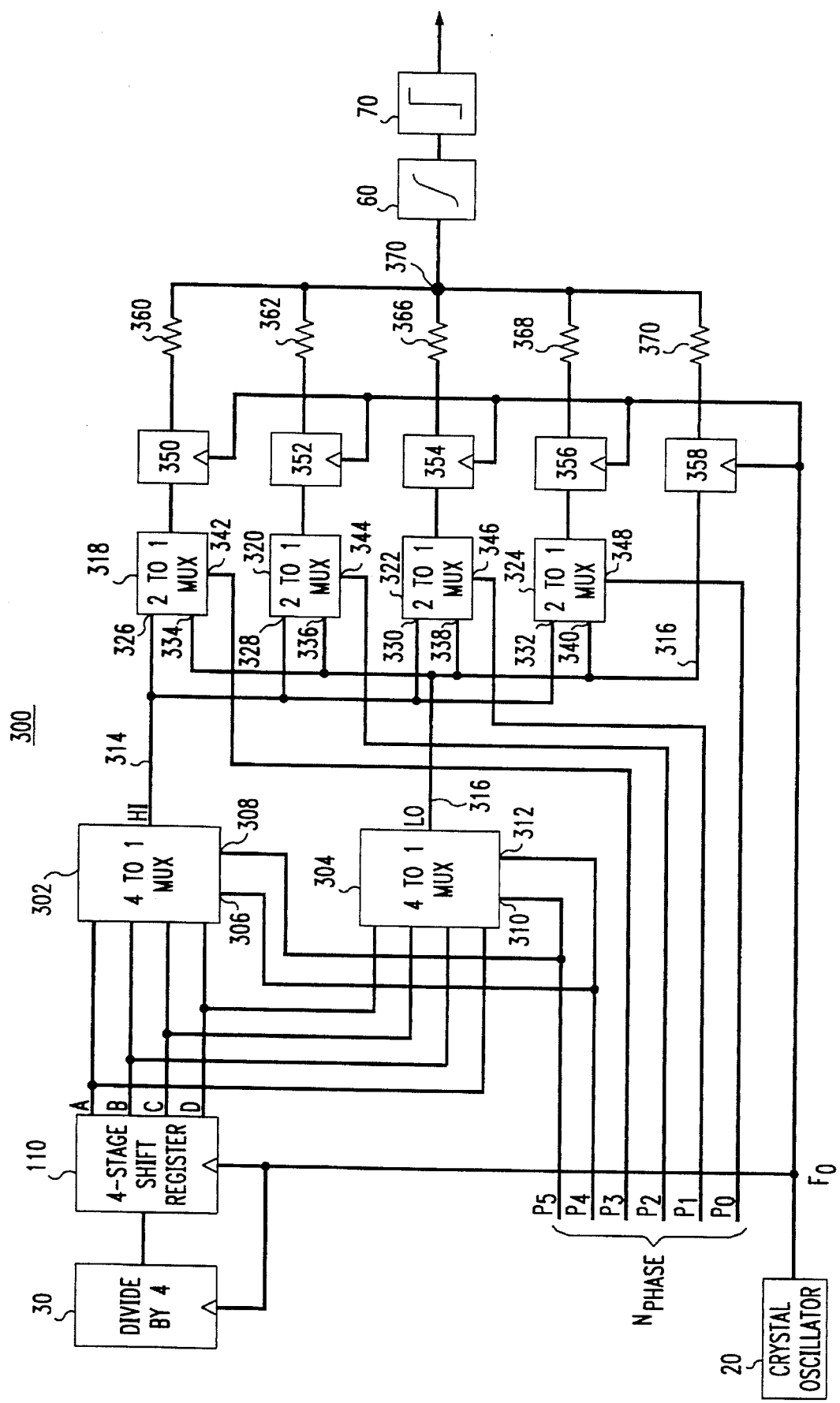
FIG. 6 illustrates yet another preferred embodiment of the phase synthesizer of FIG. 1 in accordance with the subject invention.

Yet another preferred embodiment of the phase synthesizer 10 (FIG. 1) in accordance with the subject invention is illustrated in FIG. 6 and is designated generally by reference numeral 300. The incremental phase shifter 300 performs the same function as the phase synthesizer 100 of FIG. 2, that is, the output of the limiter circuit 70 is equal to $f_{o/4}$, wherein $f_o$ corresponds to the frequency of the crystal oscillator 20.

Phase synthesizer 300 includes the provision of the crystal oscillator (MCO) 20, counting circuit 30, 4-stage shifter register 110, integrator circuit 60 and limiter circuit 70 which all perform identical functions in correspondence to their implementation in the phase synthesizer 100 of FIG. 2. However, phase synthesizer 300 includes the provision of 4 to 1 multiplexers (MUXs), 2 to 1 MUXs and accompanying latch and summing resistors, as will be described below, which are operative to provide a weighted input W of the 6-bit binary number ($p_0$, $p_1$, $p_2$, $p_3$, $p_4$, $P_5$) ($N_{phase}$) to the integrator circuit 60.

In reference to FIG. 6, the phase synthesizer 300 includes a first 4 to 1 MUX 302 wherein its respective inputs are coupled to the respective outputs of the 4-stage shift register 110. A second 4 to 1 MUX 304 is further coupled at its inputs to the respective outputs of the 4-stage shift register 110. The address selectors 306 and 308 of MUX 302, as well as the address selectors 310 and 312 of MUX 304 are coupled to the two (2) most significant bits ($p_4$, $p_5$) of the 6-bit binary number $N_{phase}$. MUX 302 is operative to determine and output, via line 314, the aforementioned HI phase value in dependence upon the values of $p_4$ and $p_5$. MUX 304 is operative to determine and output, via line 316, the aforementioned LO phase value in dependence upon the values of $p_4$ and $p_5$.

The phase synthesizer 300 further includes 2 to 1 MUXs, 318, 320, 322 and 324. The respective inputs 326, 328, 330 and 332 of the later MUXs are coupled to the HI phase value, via line 314, of MUX 302. The respective inputs 334, 336, 338 and 340 of MUXs 318, 320, 322 and 324 are coupled to the LO phase value, via line 316, of MUX 304. The respective address selectors 342, 344, 346 and 348 of MUXs, 318, 320, 322 and 324 are respectively coupled to the four (4) least significant bits ($p_3$, $p_2$, $p_1$, $P_0$) of the 6-bit binary number $N_{phase}$. Therefore, MUXs 318, 320, 322 and 324 are operative to output either the HI or LO phase value in dependence upon the value of respectively address selectors 342($p_3$), 344($p_2$), 346($p_1$) and 348($p_0$).

Latching devices 350, 352, 354 and 356 are further provided and are respectively coupled to the outputs of MUXs 318, 320, 322 and 324 and are operative to latch and stabilize the outputs of the later mentioned MUXs. Latching device 358 is additionally provided and has its input coupled to the LO phase value, via line 316. Therefore, the output value of latch device 358 is always equal to the LO phase value.

With continued reference to FIG. 6, summing resistors 360, 362, 366 368 and 370 respectively coupled to the outputs of latching devices 350, 352, 354, 356 and 358. In particular, the conductances of the aforementioned summing resistors are listed below:

| Summing Resistor | Conductance (G = 1/R) |
|---|---|
| 360 | 1/8 |
| 362 | 1/4 |
| 366 | 1/2 |
| 368 | 1 |
| 370 | 1 | wherein the aforementioned weighted output W at node 370 (the input to integrator circuit 60) equals:

$$W = N \bullet HI + (16-N) \bullet LO.$$

An example of the sequence of operation of the phase synthesizer 300, in correlation with the output W at node 370 is illustrated in the below listed table:

| $P_3$ | $P_2$ | $P_1$ | $P_0$ | N | Output W at node 370 (W = N · HI + (16 − N) · LO) |
|---|---|---|---|---|---|
| 0 | 0 | 0 | 0 | 0 | 16 · LO |
| 0 | 0 | 0 | 1 | 1 | 15 · LO + HI |
| 0 | 0 | 1 | 0 | 2 | 14 · LO + 2 · HI |
| 0 | 0 | 1 | 1 | 3 | 13 · LO + 3 · HI |
| 0 | 1 | 0 | 0 | 4 | 12 · LO + 4 · HI |
| 0 | 1 | 0 | 1 | 5 | 11 · LO + 5 · HI |
| 0 | 1 | 1 | 0 | 6 | 10 · LO + 6 · HI |
| 0 | 1 | 1 | 1 | 7 | 9 · LO + 7 · HI |
| 1 | 0 | 0 | 0 | 8 | 8 · LO + 8 · HI |
| 1 | 0 | 0 | 1 | 9 | 7 · LO + 9 · HI |
| 1 | 0 | 1 | 0 | 10 | 6 · LO + 10 · HI |
| 1 | 0 | 1 | 1 | 11 | 5 · LO + 11 · HI |
| 1 | 1 | 0 | 0 | 12 | 4 · LO + 12 · HI |
| 1 | 1 | 0 | 1 | 13 | 3 · LO + 13 · HI |
| 1 | 1 | 1 | 0 | 14 | 2 · LO + 14 · HI |
| 1 | 1 | 1 | 1 | 15 | LO + 15 · HI |

As mentioned above, the respective phase values of HI and LO are determined by MUXs 302 and 304 from the output of the 4-bit shift register 110 in dependence upon the two (2) most significant bits ($p_44$, $p_5$) of the 6-bit binary number $N_{phase}$. An example of the sequence of operation of MUXs 302 and 304 is illustrated in the below listed table:

| $P_5$ | $P_4$ | MUX 302 output (HI) | MUX 304 output (LO) |
|---|---|---|---|
| 0 | 0 | A | D |
| 0 | 1 | B | A |
| 1 | 0 | C | B |
| 1 | 1 | D | C |

The weighted output W is then integrated by the integrator circuit 60 and limited in limiter circuit 70 so as to have a value of LO+(N●T)/4+(a constant), wherein the constant corresponds to a fixed offset and LO is used as a reference value. Therefore, the output of the limiter circuit 70 generates the aforementioned square wave $f_o/4$ of approximately 12.352 MHz, wherein the clock rate of the MCO 20 is approximately 49.408 MHz.

What has been described is merely illustrative of the application of the principles of the present invention. Other arrangements and methods can be implemented by those skilled in the art without departing from the spirit and scope of the invention.

What is claimed is:

1. A phase synthesizer for use in clock extraction circuitry comprising:
   a) a reference signal source;
   b) frequency dividing means for providing a signal wave from said reference signal source, said signal wave having a plurality of phases;
   c) selection means coupled to said frequency dividing means for providing an adjacent pair of phases from said plurality of phases of said signal wave, said selection means being coupled to a quadrant select signal, said quadrant select signal being determinative of said adjacent pair of phases; and
   d) circuit weighting means coupled to said selection means for providing a signal having a phase within the range between the phases of said adjacent pair of phases, said circuit weighing means being coupled to a weighted signal, said weighted signal being determinative of the phase of the signal derived from said circuit weighing means.

2. A phase synthesizer as recited in claim 1, further comprising means for deriving a square wave output from said signal derived from said circuit weighting 3. A phase synthesizer as recited in claim 2, wherein said means for deriving square wave includes an integrator circuit coupled to a limiting circuit.

4. A phase synthesizer as recited in claim 1, wherein said reference signal source includes a crystal oscillator.

5. A phase synthesizer as recited in claim 4, wherein said frequency dividing means includes a counting circuit adapted to generate a four-phase square wave output from the signal derived from the crystal oscillator.

6. A phase synthesizer as recited in claim 5, wherein said selection means includes a quadrant select switch circuit operative to provide the adjacent pair of phases from said four phase square wave output generated from said counting circuit.

7. A phase synthesizer as recited in claim 6, wherein said circuit weighting means includes a hybrid weighting circuit operative to combine a weighted amount of said adjacent pair of phases derived from said quadrant select switch circuit and output a signal having a phase corresponding to each respective phase of said adjacent pair of phases.

* * * * *